(12) United States Patent
Mautz et al.

(10) Patent No.: US 6,895,294 B2
(45) Date of Patent: May 17, 2005

(54) ASSEMBLY COMPRISING A PLURALITY OF MASK CONTAINERS, MANUFACTURING SYSTEM FOR MANUFACTURING SEMICONDUCTOR DEVICES, AND METHOD

(75) Inventors: Karl Emerson Mautz, Austin, TX (US); Alain Bernhard Charles, Singapore (SG); John George Maltabes, Austin, TX (US); Ralf Schuster, Dresden (DE)

(73) Assignees: Freescale Semiconductor, Inc., Austin, TX (US); Infineon Technologies SC300 GmbH & Co. oHG, Dresden (DE); Infineon Technologies AG, Munich (DE)

( * ) Notice: Subject to any disclaimer, the term of this patent is extended or adjusted under 35 U.S.C. 154(b) by 724 days.

(21) Appl. No.: 09/729,636

(22) Filed: Dec. 4, 2000

(65) Prior Publication Data

US 2003/0074097 A1 Apr. 17, 2003

(51) Int. Cl.⁷ .............................................. G06F 19/00
(52) U.S. Cl. ..................................... 700/121; 700/115
(58) Field of Search ........................ 700/121, 112–117

(56) References Cited

U.S. PATENT DOCUMENTS

| | | | |
|---|---|---|---|
| 5,166,884 A | * 11/1992 | Maney et al. | ................ 700/113 |
| 5,411,358 A | 5/1995 | Garric et al. | |
| 6,098,809 A | 8/2000 | Okada et al. | |
| 6,259,961 B1 | * 7/2001 | Inoue et al. | ................ 700/112 |
| 6,468,021 B1 | * 10/2002 | Bonora et al. | .............. 414/522 |
| 6,481,558 B1 | * 11/2002 | Bonora et al. | ........... 198/346.2 |
| 6,579,052 B1 | * 6/2003 | Bonora et al. | ......... 414/222.01 |
| 6,662,950 B1 | * 12/2003 | Cleaver | ...................... 206/710 |

FOREIGN PATENT DOCUMENTS

WO          WO 00/56633          9/2000

\* cited by examiner

*Primary Examiner*—Leo Picard
*Assistant Examiner*—Zoila Cabrera
(74) *Attorney, Agent, or Firm*—Joanna G. Chiu; Robert L. King

(57) ABSTRACT

The present invention relates to a system for the manufacture of semiconductor devices by lithography, and in particular to an assembly of mask containers for use in such a system. The system comprises: a plurality of mask containers adapted to engage with one another such that two or more containers can be carried together as a stack; a plurality of lithography bays; a transport rail system for carrying the containers between different lithography bays. Each lithography bay has a transmitter/receiver unit for communicating lithography data with a tracking device located in each container, allowing for more efficient mask management. The transportation of the containers in stacks results in an improvement in efficiency.

19 Claims, 2 Drawing Sheets

ASSEMBLY COMPRISING A PLURALITY OF MASK CONTAINERS, MANUFACTURING SYSTEM FOR MANUFACTURING SEMICONDUCTOR DEVICES, AND METHOD

FIELD OF THE INVENTION

The present invention relates to semiconductor device fabrication, in particular to an assembly of mask containers for use in the fabrication of semiconductor integrated circuits.

BACKGROUND OF THE INVENTION

The fabrication of semiconductor integrated circuits normally involves a sequence of stages. Many of these stages involve coating a semiconductor wafer with photoresist and exposing the coated wafer to light passing through a mask (also known as a reticle). The exposure of a wafer in this way is carried out using an exposure tool, normally part of a lithography bay, and thus the mask may be referred to as a lithography mask.

The same exposure tool may be used with different masks for different stages in a production sequence, or an exposure tool may be dedicated to a particular stage in the production sequence, and only use a single mask. In either case, the mask is normally removable from the exposure tool.

In factories where integrated circuits are manufactured, and in particular in a factory processes 300 mm wafers, there will normally be many exposure tools running at the same time. One mask may have to be used on more than one exposure tool, and a mask may therefore have to be transported from one exposure tool to another.

Masks are normally carried by a human operator between different exposure tools or between an exposure tool and a storage area. When being carried or stored, a mask will be kept in a mask container (also known as a mask holder) in order to protect it from damage and airborne particles. Usually, the containers are made from plastic.

Because in a typical integrated circuit factory a large number of masks are in circulation, co-ordinating the use of these masks to reduce the amount of time that an exposure tool has to wait for the necessary mask to arrive can be difficult.

It is an object of the invention to address these issues.

DETAILED DESCRIPTION OF THE PREFERRED EMBODIMENTS

Figure 1:
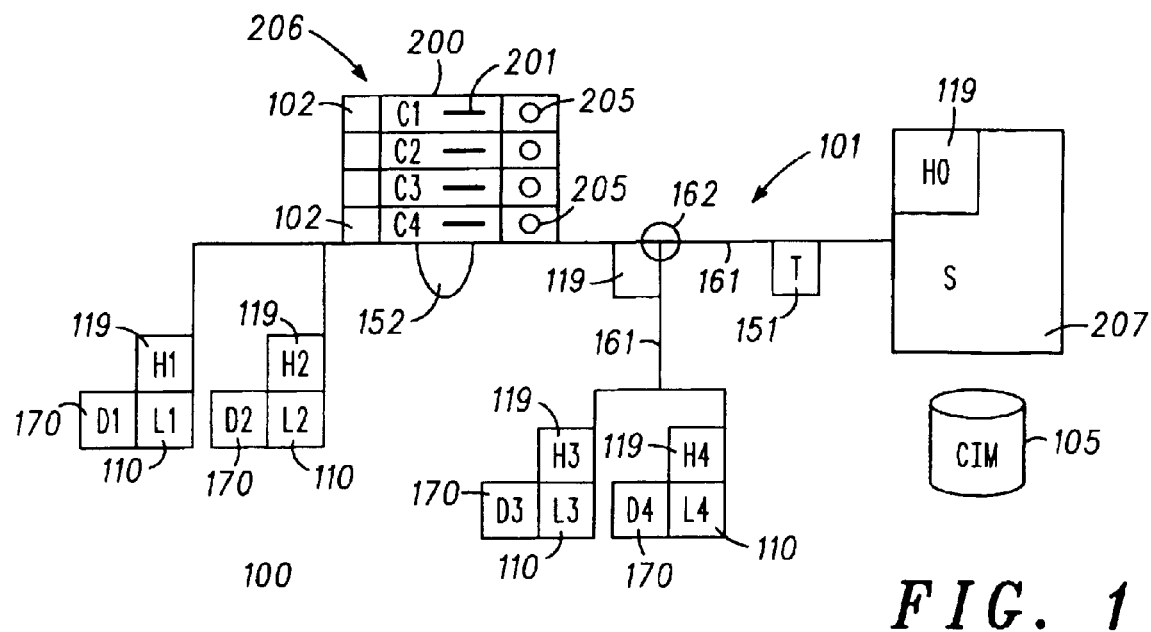
FIG. 1 shows a simplified block diagram of a first manufacturing system for manufacturing semiconductor devices according to the invention.

According to one aspect of the present invention, there is provided an assembly comprising a plurality of mask containers, each for holding one or more lithography masks, wherein each one of the containers has an engaging apparatus adapted to engage with the corresponding engaging apparatus on another one of the containers, such that two or more containers can be stacked together in a fixed relationship to one another, and wherein each mask container has an electronic tracking device, the tracking device having a receiver unit for receiving lithography data, a memory for storing the lithography data, a processor unit for reading or writing the lithography data to or from the memory, and a transmitter unit for transmitting the lithography data read from the memory.

It will be understood that the term lithography data may include any type of data that can be generated, used or transferred in the manufacture of semiconductor devices.

Mask containers containing masks to be used sequentially as a set or masks that are otherwise related can be engaged or locked together in a stack. The stack of mask containers can be transported to a lithography bay having an exposure tool. The stack of mask containers can be placed in the lithography bay and each mask can be removed from a container one at a time for loading in the exposure tool. The stack of containers need not be disassembled, thereby making it easier to return the masks to their correct containers, and reducing the chance that a mask will become separated from the other masks in its set.

Once the masks in the stack have been used by an exposure tool, the stack can be returned to a storage area, or if another exposure tool requires the same set of masks, the stack can be transported to that exposure tool. Because the mask containers are engaged together as a stack, they can more easily be carried, making it less likely that the masks will become disordered or lost.

Because each container has an electronic tracking device, data corresponding to a mask within the container can be obtained without having to open the box.

The engaging apparatus may comprise a latching mechanism wherein one face of a container has a sprung latch, and an opposite face of the container has a catch, such that two or more masks may be engaged by engaging the catch of one mask with the latch of another mask. The latching mechanism will preferably allow two boxes to snap fit together. The latching mechanism may be of the push-pull type and may be releasable by a lever.

The containers will preferably be stacked such that their sides line up with one another, but the containers may be stacked in a stepwise fashion.

The lithography data stored in the tracking device may include specification data such as the type, version or other specifications of mask that is kept in the container, information on the alignment marks of the mask, a unique code identifying the mask, the processing conditions in which the mask is to be used (e.g., exposure time, wavelength), and the types of exposure tools and processing steps the mask is suitable for. The lithography data may also include status data such as the history of the processing steps the mask has been used for, details of the exposure tools in which the mask has been used or is to be used, known defects in the mask or problems with its use.

The receiver unit and the transmitter unit may each be a wireless device, for example operating at a radio frequency. Alternatively the receiver unit may be an infra-red photo detector and the transmitter unit may be an infra-red diode. In a preferred embodiment, the receiver unit and the transmitter unit transmit data through an electrical conductor, and each comprise an electrical contact for contacting the electrical conductor.

Initially, when a mask is first placed in a container, data on the specification of the mask will be written to the tracking device.

Data may be read from the tracking device by a hand-held instrument having a receiver for receiving lithography data from the hand-held device.

The exposure tools will preferably each have a reading apparatus for downloading lithography data from the tracking device in each mask container. The downloaded data can then be used by the exposure tool to set the exposure and other parameters appropriate to the particular stage in the processing sequence in which the mask is to be used.

In addition, the exposure tools will preferably each have a communication apparatus for communicating lithography data to the tracking device. If a mask container is used for the first time, or with a new mask, the communication apparatus on an exposure tool may be used to communicate specification data regarding the specifications of the mask to the tracking device. Otherwise, if the tracking device already had specification data, the communication apparatus associated with an exposure tool may communicate status data to the tracking device which can be used by the next exposure tool to which the mask is taken. The status data communicated to the tracking device will preferably be added to or will update any existing status data already held by the tracking device.

Preferably, a rail system having at least one transport rail will be provided for carrying the lithography containers between different lithography bays. The containers will preferably each have a rail engagement apparatus for movably engaging with the rail, which apparatus may include a slide, bearings or wheels. Preferably, the rail engagement apparatus on each mask container will be releasable, so that the container can be removed from the rail and either stored or placed in a position ready for loading into an exposure tool.

A traction apparatus for moving the containers along the rail will also preferably be provided. The traction apparatus may include a moving belt or cable which can engage with mask containers on the rail. Alternatively, the traction apparatus may comprise a plurality of individual motors arranged such that each motor can move a single stack of mask containers (or a single mask container) independently.

Where a group of containers are engaged together as a stack, only one of the containers in the stack may be engaged with the rail (i.e., physically connected to the rail).

The rail system will preferably include an handling apparatus for automatically loading or unloading mask containers onto or from a rail, rather than having a human operator carry out these tasks by hand. The handling apparatus may also bring mask containers into stacked engagement with one another and release a container from a stack. The handling apparatus will preferably be controlled by a central computer adapted to exchange lithography data whit the mask containers.

Nodes may be provided in the rail system where stacks of mask containers can be put together or separated, either by a human operator or by the handling apparatus. The masks being added or removed from a stack can travel along a rail leading to the node.

The mask containers will preferably be kept in a stocker compartment when the masks which they contain are not in use. When a set of masks is to be used in a fabrication sequence, the handling apparatus may select the corresponding masks containers from the stocker and bring these masks together into engagement as a stack. The stack may then be transported on a rail to the appropriate exposure tool. When the same set of masks is required by another exposure tool, the stack can easily be transported to that tool without having to reassemble the stack.

The tracking devices of the mask containers in a stack may be adapted to communicate lithography data with each other. In one embodiment, the processors of the tracking devices in each container will be programmed to identify the other containers in the stack and select between themselves one tracking device to transmit lithography data representative of all the containers in the stack, thereby reducing the duplication of data transfer.

If a set of masks needs to be modified, mask containers can be added or removed from the stack at a rail node, or a new stack can be formed by selecting masks containers from the stocker compartment.

Each mask container will preferably only contain a single mask, but some mask containers may be adapted to contain two or more masks, for example in situations where two or more masks are always used one after another.

According to another aspect of the invention, there is provided a manufacturing system for manufacturing semiconductor devices comprising:

a plurality of mask containers, each for holding one or more lithography masks, each one of the containers having a locking apparatus adapted to engage with locking apparatus on another one of the containers, such that two or more containers can be carried together in a fixed relationship to one another;

a plurality of lithography bays;

a transport rail for carrying the containers between different lithography bays;

wherein each lithography bay has a transmitter unit and a receiver unit for respectively transmitting and receiving lithography data, and each mask container has an electronic tracking device having a receiver unit for receiving lithography data from a lithography bay, a memory for storing the lithography data, a processor unit for reading or writing the lithography data to or from the memory, and a transmitter unit for transmitting the lithography data read from the memory to the same lithography bay or another lithography bay.

According to yet another aspect of the invention, there is provided a manufacturing system for manufacturing semiconductor devices comprising:

a plurality of mask containers, each for holding one or more lithography masks;

a plurality of lithography bays;

a transport rail system for carrying the containers between different lithography bays, the transport rail system having a carrier and the mask containers each having an engaging apparatus for engaging with the carrier such that the mask containers can be carried by the rail system;

wherein each lithography bay has a transmitter unit and a receiver unit for respectively transmitting and receiving lithography data, and each mask container has an electronic tracking device having a receiver unit for receiving lithography data from a lithography bay, a memory for storing the lithography data, a processor unit for reading or writing the lithography data to or from the memory, and a transmitter unit for transmitting the lithography data read from the memory to the same lithography bay or another lithography bay.

Preferably, the rail system carries the mask containers, for example, by a stack or by a frame with slots (e.g., one slot for one container). In the stack version, only containers at an outer position can be removed or added; in the frame version, random access to the containers is possible. As persons of skill in the art understand without the need of further explanation, "intelligent" stacking can be provided such that the rail systems picks up the containers in an inverse order by which the rail system releases the containers from the stack. In other words, the order by which the containers are stacked (in terms of location) anticipates the sequence by which the containers are released from the stack (in terms of time).

According to yet another aspect of the invention there is provided an assembly comprising a plurality of mask containers, each for holding one or more lithography masks, wherein each one of the containers has an engaging apparatus adapted to engage with the engaging apparatus on another one of the containers, such that two or more containers can be stacked together in a fixed relationship to one another, and wherein each mask container has an electronic tracking device, the tracking device having a receiver unit for receiving first lithography data, a memory for temporarily storing the first lithography data, a processor unit for processing the first lithography data and for providing second lithography data, and a transmitter unit for transmitting the second lithography data.

In FIG. 1, there is shown a manufacturing system 100 for the manufacture of semiconductor devices using lithography. The manufacturing system 100 has a plurality of lithography bays 110 (L1–L4), each of which has an exposure tool (not shown).

A plurality of mask containers 200 (C1–C4) are engaged together in a stack 206 by means of an engaging apparatus, generally referred to as 102. Each container 200 contains a mask 201 for use in the exposure tool of one of the lithography bays 110. Although only four mask containers are shown in FIG. 1, typically up to twelve containers will be grouped together in a stack.

The stack 206 of containers 200 is shown in FIG. 1 being carried on a rail system 101 which connects between the different lithography bays 110 and a storage area 207 (S) for storing containers 200. The rail system has a plurality of rails 161 which connect at least one node 162. The rail system also has a traction apparatus 151 (T) to move the containers along the rails 161.

Rail engagement means 152 are provided to movably engage with at least one of the containers 200 (shown here as C4) with the rail or rails of the rail system 101. The containers 200 can be transported either as a stack 206 or individually between different lithography bays 110 or between a lithography bay 110 and the storage area 207.

Each lithography bay 110 and the storage area 207 is provided with handling apparatus 119 (H0–H4) for automatically placing the mask containers 200 onto the rail system 101 and removing the mask containers when they have arrived at their destination, or when a stack is partially assembled/disassembled at a node 162.

Each lithography bay 110 has data transmitter and a receiver 170 (D1–D4) for sending and receiving lithography data, and each container 200 has an electronic tracking device 205 (circle symbols, cf. also FIGS. 2–3) for receiving and storing lithography data from any one of the lithography bays 110, and for communicating data. Therefore, when a stack 206 of mask containers 200 is delivered to a lithography bay 110, lithography data concerning the masks in the stack can be transferred to the lithography tool in the lithography bay and the exposure or other variable of the lithography tool can be set as a function of the transferred lithography data.

Lithography data may also be exchanged between the lithography bays 110, the tracking devices 205, and a central computer 105 (CIM). In addition, central computer 105 may control the traction apparatus 151 in order to govern the movement of mask containers 200. Because the containers can be transported in stacks 206, the amount of transport tasks that need to be controlled by the central computer will be reduced.

Lithography data may be transmitted and received by the tracking devices using wireless means such as radio waves or infra-red radiation, or alternatively, the rails 161 may be used to provide a wire connection to the tracking devices 205, the rail engagement means 152 being provided with brushes or other sliding contacts with the transport rails to establish a movable electrical contact between the tracking device and the rails 161. Power to the tracking devices may also be provide via the rails 161, or each tracking device may have a power supply.

Figure 2:
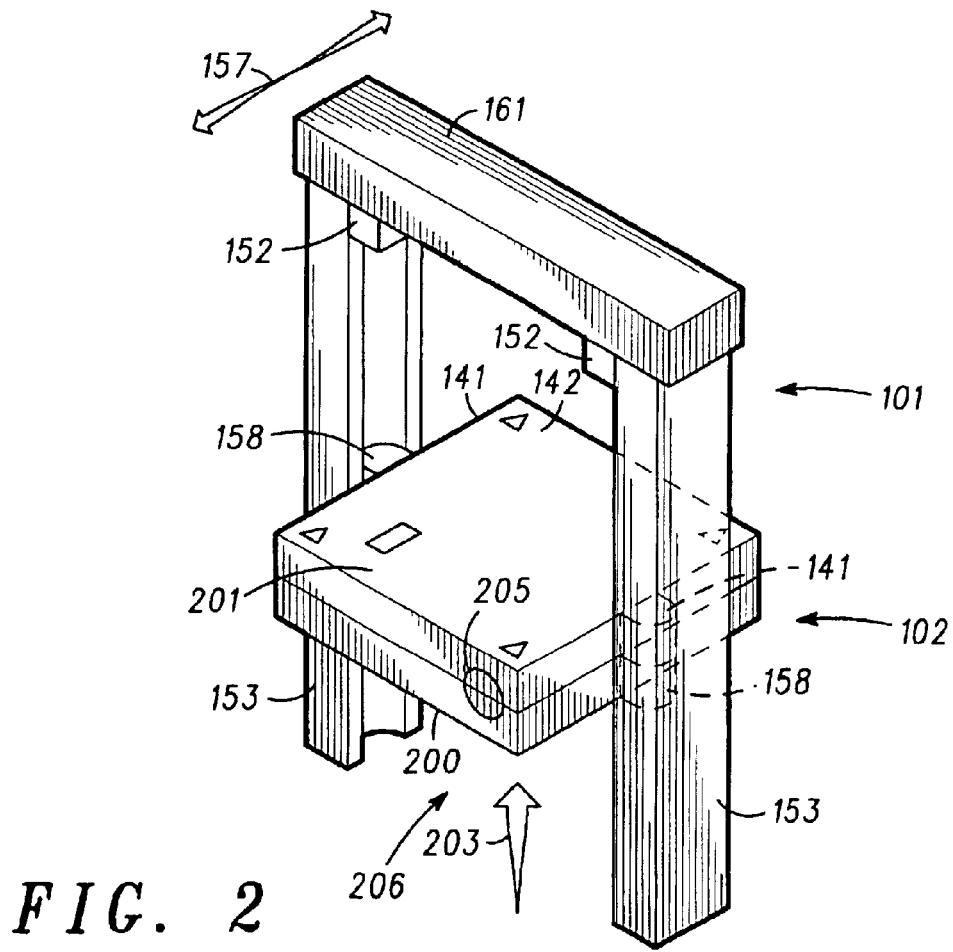
FIG. 2 shows a rail carrying a stack of containers in one embodiment.
Figure 3:
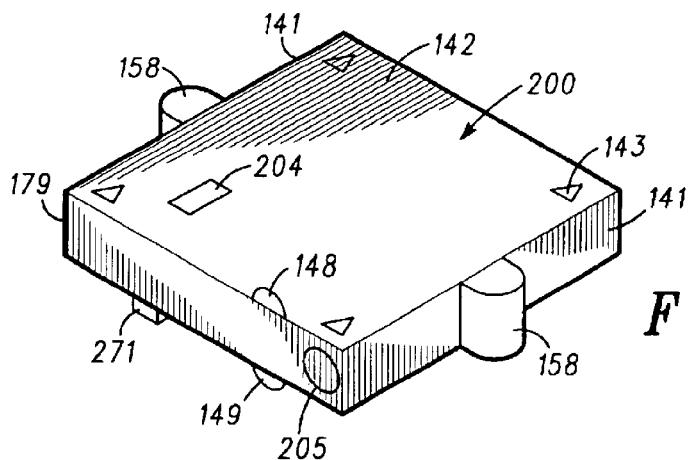
FIG. 3 shows an individual mask container.

FIGS. 2–3 illustrate further details; wherein FIG. 2 shows in more detail the engagement apparatus 102 for carrying the containers 200 as a stack 206; and FIG. 3 shows an individual container 200. In this example the rail system 101 employs an overhead rail 161 (only a short section of which is shown in FIG. 2) and the containers 200 travel in a suspended position below the rail 161.

The containers 200 are held at each side between a pair of vertical retaining members 153, which are here shown in the form of beams. Each of retaining members 153 is suspended from the rail 161 at its upper end by a travel mechanism 152 which allows the retaining members to travel together on the rail 161 in the direction shown by the arrow 157.

The containers 200 are connected at each side 141 to a retaining member 153 by means of a lockable slide mechanism 158, which can be placed in a vertical locking state in which it retains the vertical position of the containers 200, for example when they are being transported, or in an unlocked state in which it allows the containers 200 to be moved in a vertical direction for stacking and unstacking.

The lockable slide mechanism 158 has a locked horizontal locking state in which it prevents relative horizontal movement between the retaining members 153 and the containers 200, and an unlocked horizontal locking state in which the containers can slide horizontally into or out of engagement with the retaining members 153 (in the direction of the arrow 157). The slide mechanism will normally be in the horizontal locking state to prevent the containers 200 from becoming detached from the retaining members 153 when the containers 200 are being transported. However, when containers are to be loaded or unloaded on to the rail system 101, the lockable slide mechanism 158 will be in the unlocked horizontal locking state.

To reduce the amount of relative horizontal movement between the containers 200 when stacked, a plurality of projections 143 are located on the top faces 142 of each container 200 which projections engage with corresponding recesses in the lower face of each container. The projections 143 allow the containers to engage with one another when stacked. Preferably, the projections are pyramidal shaped, but other tapering (e.g., circular shape) can also be used.

Preferably, each container has an electrical contact 204 on its upper face and a corresponding contact 271 on its lower face, each contact being positioned such that when two or more containers are correctly stacked, the lower contact of one container makes an electrical connection with the upper contact 204 of the container beneath it so as to close an electrical circuit. When the circuit is closed, the containers are presumed to be correctly stacked. As illustrated by the circle symbols (cf. FIG. 1), device 205 (details in FIGS. 2–3) is attached to container 200.

Preferably, the container 200 has a side face 179 which can be opened in order to access the mask within the container 200.

Optionally, each container 200 may have individual engagement apparatus 148, 149 on its upper and lower faces respectively, to allow containers to engage directly with each other.

Figure 4:
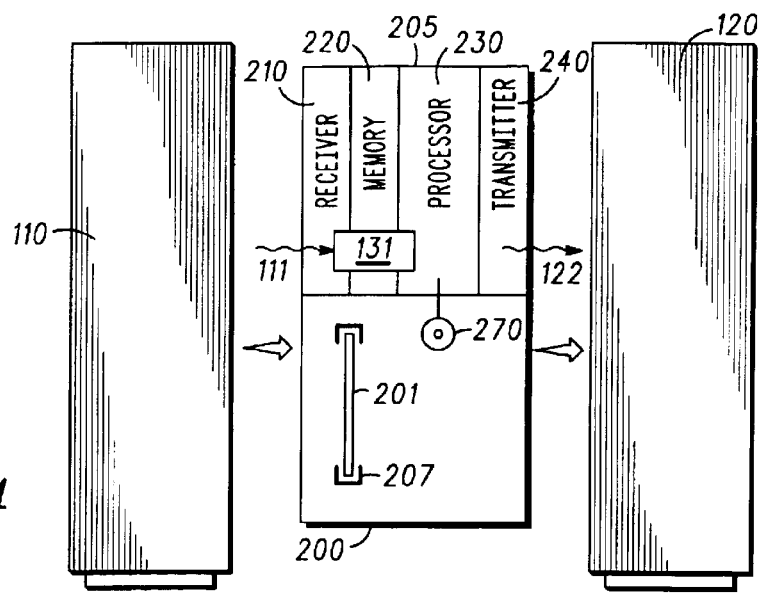
FIG. 4 shows a simplified block diagram of a second manufacturing system for manufacturing semiconductor devices, wherein the manufacturing system has a tracking device.

FIG. 4 is a simplified block diagram of a simplified embodiment of a further semiconductor wafer manufacturing system 100 with first station 110, second station 120, mask container 200, and electronic tracking device 205 (hereinafter a device) according to the present invention. The device 205 is associated with mask container 200 and comprises: receiver unit 210 to receive first data 111 (arrow), memory unit 220 to temporarily store first data 111, processor unit 230 to process first data 111 and to provide second data 122 (arrow), and transmitter unit 240 to transmit second data 122.

Mask container 200 (hereinafter a container) is any suitable enclosure that protects lithography mask 201 from contamination (e.g., by particles). Container 200 can also be empty, for example, for container 200 that is being cleaned.

Mask container 200 carries lithography mask 201 between a first lithography bay (hereinafter a first station) 110 and a second lithography bay (hereinafter a second station) 120. Station 110 uses mask 201 (or container 200) in a first process and at a later time-point, station 120 uses mask 201 in a second process.

Preferably, a first lithography data 111 is indicative on how station 120 has used mask 201 in the first process, and a second lithography data 122 is indicative on how station 120 uses mask 201 in the second process. Preferably, transmitter unit 240 transmits second data 122 to station 120 before station 120 uses mask 201 in the second process.

Preferably, a processor unit 230 processes first data 111 by combining first data 111 with an instruction 131. Preferably, instruction 131 is a set of commands of computer executable program code. Preferably, instruction 131 is also indicative on how mask 201 is used in the second process. A receiver unit 210 receives instruction 131, for example, from a host computer. It is convenient that receiver unit 210 receives first data 111 at a first time point and receives instruction 131 at a second time point that comes later. Protocols that ensure reception and transmission to receiver unit 210 and from transmitter unit 240 are well known in the art. Optionally, processor unit 230 receives first data 111 from sensor 270 located within mask container 200.

The term operating a lithography tool (and its language variations) is intended to comprise at least one of the following actions:

removing mask 201 from container 200;
inserting mask 201 into container 200;
removing a mask 201, returning the mask to a container and subsequently removing another mask from a different container;
unstacking the containers 200 in a stack 206;
reassembling a stack;
adding data to mask 201 in electronic form (i.e. writing to electronic device 205),—optionally—also physically (e.g., by adding a barcode label);
reading data from mask 201 (e.g., reading the barcode label);
exposing a semiconductor wafer (not illustrated) or any other work-product by sending electromagnetic radiation through mask 201;
storing mask 201;
manufacturing mask 210;
maintaining mask 210 (e.g., cleaning);
monitoring the transmission properties of a mask (e.g., due to repeated exposure, the mask transmits less radiation);
damaging mask 201, disposing of mask 201, recycling mask 201, or any other action that removes mask 201 from the factory;
testing and measuring the properties of mask 201, either directly (e.g., evaluating an exposure picture), or indirectly, (e.g., evaluating a wafer exposed to radiation by the mask);
assigning an identifier for mask 201;
assigning an identifier for a plurality of masks 201 (e.g., type classification); and
transferring information that relates to mask 201 from a first electronic device in a first container to a further electronic device in a further container.

This action catalogue will be referred to later in connection with a method.

For example, and without the intention to be limiting, station 110/120 can have or is the following: a mask sorter for inserting the mask into the container, removing the mask from the container, inserting and removing multiple masks to and from containers; a lithography exposure tool for exposing a semiconductor wafer (not illustrated) or any other work-product by sending electromagnetic radiation through the mask (the main purpose of the mask); a tool for writing data to the mask or reading data from the mask; a manufacturing tool for manufacturing the mask or for assigning a single identifier for a single mask or a single identifier to a plurality of masks; a metrology tool for testing and measuring the properties of the mask; a cleaning tool for removing contamination from the mask.

Having used the term mask in connection with the above mentioned actions is convenient; however, persons skilled in the art are able, based on the disclosure herein, to practice the present invention also for actions with mask containers 200, independently whether the container carries a mask or not.

Figure 5:
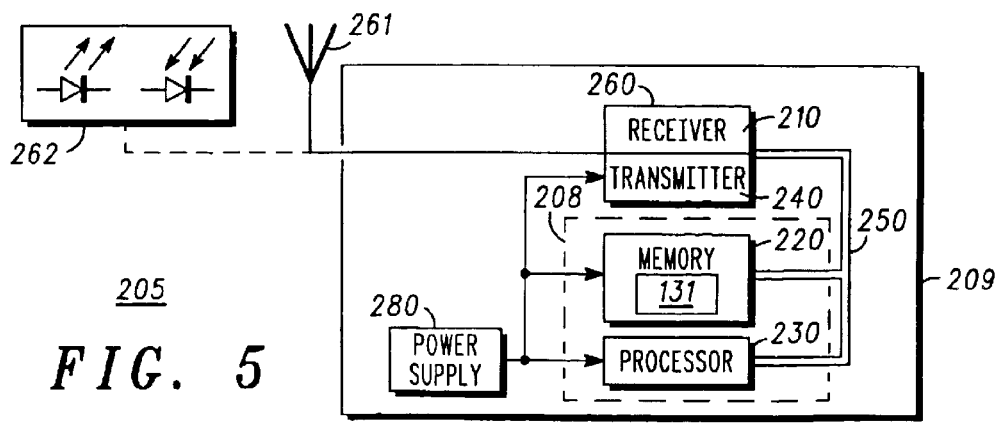
FIG. 5 shows with more detail a simplified block diagram of a tracking device of FIG. 1.

FIG. 5 is a simplified block diagram of electronic device 205 of FIG. 4 with more detail. Electronic device 205 is shown with receiver unit 210, memory unit 220, processor unit 230, transmitter unit 240, as well as with bus 250 coupling them. Preferably, processor unit 230 and memory unit 220 are implemented on a single monolithic chip (embedded microprocessor, dashed from 208).

Preferably, the receiver unit 210 and transmitter unit 240 are combined to transceiver unit 260. Conveniently, transceiver unit 260 is a wireless transceiver operating as radio frequency transceiver (cf. antenna 261), or an infra-red transceiver (cf. optical interface 262 with symbols for a light emitting diode (LED) and for a photo diode). Persons of skill in the art are able to use other wireless transceivers without the need of further explanation herein. For example, a transceiver can comprise inductive coils. In case of a wire-bound transceiver, a direct electrical contact to the environment of device 205 is established.

Preferably, memory unit 220 is a non-volatile memory, such as an ERPROM or an SRAM. Volatile memories can also be used (e.g., DRAM). Conveniently, instruction 131 stored in memory unit 220 optionally comprises also information about further processes.

Power supply 280 for units 210/240, 220, 230 may be implemented by a long lasting small battery, by a photovoltaic element, by a thermal converter, by an inductive power converter that relies on externally applied electromagnetic energy or by any other suitable power supply means.

Preferably, device 205 remains attached to container 200 permanently; i.e., also when container 200 is cleaned. A convenient attaching means is adhesive 209, or a mechanical coupling means (e.g., press-fit or snap-fit coupling), or a combination therefrom. Preferably, device 205 is located at the same location for all containers 200 in factory 100. Attaching device 209 outside the container, for example, outside its plastic enclosure is convenient.

Further modifications are possible. For example, container 200 can have a barcode tag; an operator interface (e.g., display, buzzer, keys) can also be provided with device 205.

It will be understood from the above description that this invention provides a more efficient way of transporting masks within a semiconductor device factory, resulting in less downtime of lithography exposure tools due to the absence of the correct mask at the required time.

What is claimed is:

1. An assembly comprising a plurality of mask containers, each for holding one or more lithography masks, wherein each one of the containers has an engaging apparatus adapted to engage with the corresponding engaging apparatus on another one of the containers, such that two or more containers can be stacked together in a fixed relationship to one another, and wherein each mask container has an electronic tracking device, the tracking device having a receiver unit for receiving lithography data, a memory for storing the lithography data, a processor unit for reading or writing the lithography data to or from the memory, and a transmitter unit for transmitting the lithography data read from the memory.

2. The assembly as claimed in claim 1, wherein the engaging apparatus comprises a latch mounted on one face of the container, and a catch mounted on an opposite face of the container, such that two or more mask containers may be engaged by engaging the latch of one mask with the catch of another mask.

3. The assembly as claimed in claim 1, wherein each container has electrical contacts positioned such that contacts on two neighbouring containers in a stack form an electrical connection when the two containers are correctly positioned relative to each other.

4. The assembly as claimed in claim 1, wherein the receiver unit and the transmitter unit respectively receive and transmit radio frequency radiation.

5. The assembly as claimed in claim 1, wherein the receiver unit and the transmitter unit respectively receive and transmit infra-red radiation.

6. The assembly as claimed in claim 1, wherein the memory is an EEPROM.

7. The assembly as claimed in claim 1, wherein the memory is an SRAM.

8. The assembly as claimed in claim 1, wherein the tracking devices of the mask containers in a stack are adapted to communicate lithography data with each other.

9. The assembly as claimed in claim 8, wherein the tracking devices in each container are programmed to identify the other containers in the stack and select between themselves one tracking device to transmit lithography data representative of all the containers in the stack.

10. A manufacturing system for manufacturing semiconductor devices comprising:
a plurality of mask containers, each for holding one or more lithography masks, each one of the containers having a locking apparatus adapted to engage with the locking apparatus on another one of the containers, such that two or more containers can be carried together in a fixed relationship to one another;
a plurality of lithography bays;
a transport rail system for carrying the containers between different lithography bays;
wherein each lithography bay has a transmitter unit and a receiver unit for respectively transmitting and receiving lithography data, and each mask container has an electronic tracking device having a receiver unit for receiving lithography data from a lithography bay, a memory for storing the lithography data, a processor unit for reading or writing the lithography data to or from the memory, and a transmitter unit for transmitting the lithography data read from the memory to the same lithography bay or another lithography bay.

11. The manufacturing system as claimed in claim 10, wherein a handling apparatus is provided for automatically loading or unloading mask containers onto or from the rail system.

12. The manufacturing system as claimed in claim 11, wherein there is provided a handling apparatus for bringing mask containers into stacked engagement with one another and for releasing a container from a stack or automatically removing a mask from a container.

13. The manufacturing system as claimed in claim 11, wherein there is provided a central computer with an input and output port for exchanging lithography data with the mask containers and the lithography bays.

14. The manufacturing system as claimed in claim 13, wherein the rail system is provided with a traction apparatus for moving the mask containers and wherein the traction apparatus is controlled by the central computer.

15. A manufacturing system for manufacturing semiconductor devices comprising:
a plurality of mask containers, each for holding one or more lithography masks;
a plurality of lithography bays;
a transport rail system for carrying the containers between different lithography bays, the transport rail system having a carrier and the mask containers each having an engaging apparatus for engaging with the carrier such that the mask containers can be carried by the rail system;
wherein each lithography bay has a transmitter unit and a receiver unit for respectively transmitting and receiving lithography data, and each mask container has an electronic tracking device having a receiver unit for receiving lithography data from a lithography bay, a memory for storing the lithography data, a processor unit for reading or writing the lithography data to or from the memory, and a transmitter unit for transmitting the lithography data read from the memory to the same lithography bay or another lithography bay.

16. The manufacturing system of claim 15, wherein said rail system carries the mask containers in a stack.

17. The manufacturing system of claim 15, wherein said rail system carries the mask containers in a frame with slots.

18. An assembly comprising a plurality of mask containers, each for holding one or more lithography masks, wherein each one of the containers has an engaging apparatus adapted to engage with an engaging apparatus on another one of the containers, such that two or more containers can be stacked together in a fixed relationship to one another, and wherein each mask container has an electronic tracking device, the tracking device having a receiver unit for receiving first lithography data, a memory for temporarily storing the first lithography data, a processor unit for processing the first lithography data and for providing second lithography data, and a transmitter unit for transmitting the second lithography data.

19. A method of operating a semiconductor device manufacturing system, the manufacturing system comprising a plurality of mask containers each containing a single mask and each container having a tracking device for transmitting and receiving data corresponding to the mask within the container, the method comprising the following steps:

receiving lithography data from a plurality of mask containers, selecting two or more containers on the basis of the received lithography data;

operating a first automatic handling device so as to group together the selected containers in the form of a stack and to place the stack on a rail system connecting to a lithography bay having an exposure tool apparatus;

operating the rail system so as to transport the stack to the lithography bay;

further operating the exposure tool apparatus to receive lithography data from at least one of the mask containers in the stack; and, operating the lithography tool according to the data received from a mask container in the stack; wherein operating the lithography tool comprises at least one step out of the group of the following steps:

removing a mask from a container;

inserting a mask into a container;

removing a mask, returning the mask to a container and subsequently removing another mask from a different container unstacking the containers in a stack reassembling a stack adding data to a mask in electronic form;

reading data from a mask;

exposing a semiconductor wafer or any other workproduct by sending electromagnetic radiation through a mask;

storing a mask;

manufacturing a mask;

maintaining a mask;

monitoring the transmission properties of a mask;

damaging a mask, disposing of a mask, recycling a mask, or any other action that removes a mask from the factory;

testing and measuring the properties of a mask, either directly, or indirectly;

assigning an identifier for a mask;

assigning an identifier for a plurality of masks; and transferring information that relates to a mask from a first electronic device in a first container to a further electronic device in a further container.

* * * * *